(12) United States Patent
Noguchi

(10) Patent No.: US 7,511,966 B2
(45) Date of Patent: Mar. 31, 2009

(54) PRINTED CIRCUIT BOARD

(75) Inventor: Norikuni Noguchi, Kawaguchi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/976,150

(22) Filed: Oct. 22, 2007

(65) Prior Publication Data

US 2008/0130255 A1     Jun. 5, 2008

(30) Foreign Application Priority Data

Nov. 30, 2006   (JP) ............................. 2006-324803

(51) Int. Cl.
    *H05K 7/10* (2006.01)
(52) U.S. Cl. .................................. 361/771; 361/777
(58) Field of Classification Search ................. 361/771, 361/760, 777; 174/255, 260
    See application file for complete search history.

(56) References Cited

U.S. PATENT DOCUMENTS 6,650,004 B1 * 11/2003 Horie et al. ................. 257/666

6,940,724 B2 * 9/2005 Divakar et al. ............... 361/719
2003/0137813 A1 * 7/2003 Onizuka et al. ............. 361/777

FOREIGN PATENT DOCUMENTS

| JP | 04-251762 | 9/1992 |
|----|-----------|--------|
| JP | 05-082948 | 4/1993 |
| JP | 2003-283069 | 10/2003 |

* cited by examiner

*Primary Examiner*—Dean A. Reichard
*Assistant Examiner*—Andargie M Aychillhum
(74) *Attorney, Agent, or Firm*—Pillsbury Winthrop Shaw Pittman, LLP

(57) ABSTRACT

According to one embodiment, first to fourth pads are arranged on a surface mounting area of a printed circuit board along one side of the mounting area, with a preset gap defined between each pair of adjacent ones of the pads. The first to third pads form a first land, and the second to fourth pads form a second land. When a first three-terminal regulator IC is mounted on the first land, a radiator-side terminal pin incorporated in the regulator IC is connected to a first radiator pad and a common radiator pad. When a second three-terminal regulator IC is mounted on the second land, a radiator-side terminal pin incorporated in the regulator IC is connected to a second radiator pad and the common radiator pad.

5 Claims, 4 Drawing Sheets

PRINTED CIRCUIT BOARD

CROSS-REFERENCE TO RELATED APPLICATIONS

This application is based upon and claims the benefit of priority from Japanese Patent Application No. 2006-324803, filed Nov. 30, 2006, the entire contents of which are incorporated herein by reference.

BACKGROUND

1. Field

One embodiment of the present invention relates to a printed circuit board, and more particularly to a printed circuit board capable of mounting thereon three-terminal regulator ICs of different terminal-pin arrangement patterns.

2. Description of the Related Art

Three-terminal regulator ICs include DIP-type ICs that are mounted on a printed circuit board with their input, output and ground terminal pins inserted in the board, and SMT-type ICs that are mounted on a printed circuit board with their input, output and ground terminal pins connected to pads formed on the board. The invention relates to a mounting structure for SMT-type three-terminal regulator ICs.

Three-terminal regulator ICs of different makers or of different levels of performance have terminal pins arranged in different patterns.

Accordingly, a plurality of pad arrangements must be prepared for printed circuit boards in light of the arrangement patterns of the terminal pins of three-terminal regulator ICs.

However, to design a plurality of types of printed circuit boards that have different pad arrangements, huge cost is required.

In view of the above, a printed circuit board has recently been developed, which can selectively mount thereon three-terminal regulator ICs of different terminal-pin arrangement patterns.

For instance, three pads are arranged on a printed circuit board with a certain pitch along one side of a three-terminal-regulator-IC mounting region defined on the printed circuit board, and three pads are arranged with a certain pitch along the other side of the mounting region.

When a three-terminal regulator IC having a first terminal-arrangement pattern is mounted on the printed circuit board, two of the three pads along the one side are selected, and one of the three pads along the other side is selected. The terminal pins of the regulator IC are connected to the selected three pads.

Further, when a three-terminal regulator IC having a second terminal-arrangement pattern different from the first terminal-arrangement pattern is mounted on the printed circuit board, one of the three pads arranged along the one side is selected, and two of the three pads arranged along the other side are selected. The terminal pins of the regulator IC are connected to the selected three pads. (See, for example, Jpn. Pat. Appln. KOKAI Publication No. 2003-283069)

However, the printed circuit board disclosed in Jpn. Pat. Appln. KOKAI Publication No. 2003-283069 has complex circuitry, since the pads arranged in pairs symmetrically with the three-terminal-regulator-IC mounting region interposed therebetween are connected by respective semiconductor patterns. Furthermore, when a pad corresponding to a certain terminal pin is selected, it is necessary to rotate the three-terminal regulator IC through 180°. Thus, the mounting operation is also complex.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Embodiments of the invention will be described in detail with reference to the accompanying drawings.

Various embodiments according to the invention will be described hereinafter with reference to the accompanying drawings. In general, according to one embodiment of the invention, a printed circuit board comprising: a surface mounting area used to selectively mount thereon a first three-terminal regulator IC including an input terminal pin, an output terminal pin and a ground terminal pin arranged in a certain pattern, and a second three-terminal regulator IC including an input terminal pin, an output terminal pin and a ground terminal pin arranged in another pattern; a pad device including first to fourth pads arranged on the surface mounting area along one side thereof, with a preset gap defined between each pair of adjacent ones of the pads, the first to third pads forming a first land for mounting the first three-terminal regulator IC, the second to fourth pads forming a second land for mounting the second three-terminal regulator IC; and a radiator-side pad device including a first radiator pad and a second radiator pad arranged on the surface mounting area along another side thereof, with a preset gap defined therebetween, and a common radiator pad interposed between the first and second radiator pads, the output terminal pin being connected to the first radiator pad and the common radiator pad when the first three-terminal regulator IC is mounted on the first land, the output terminal pin being connected to the second radiator pad and the common radiator pad when the second three-terminal regulator IC is mounted on the first land.

Figure 1:
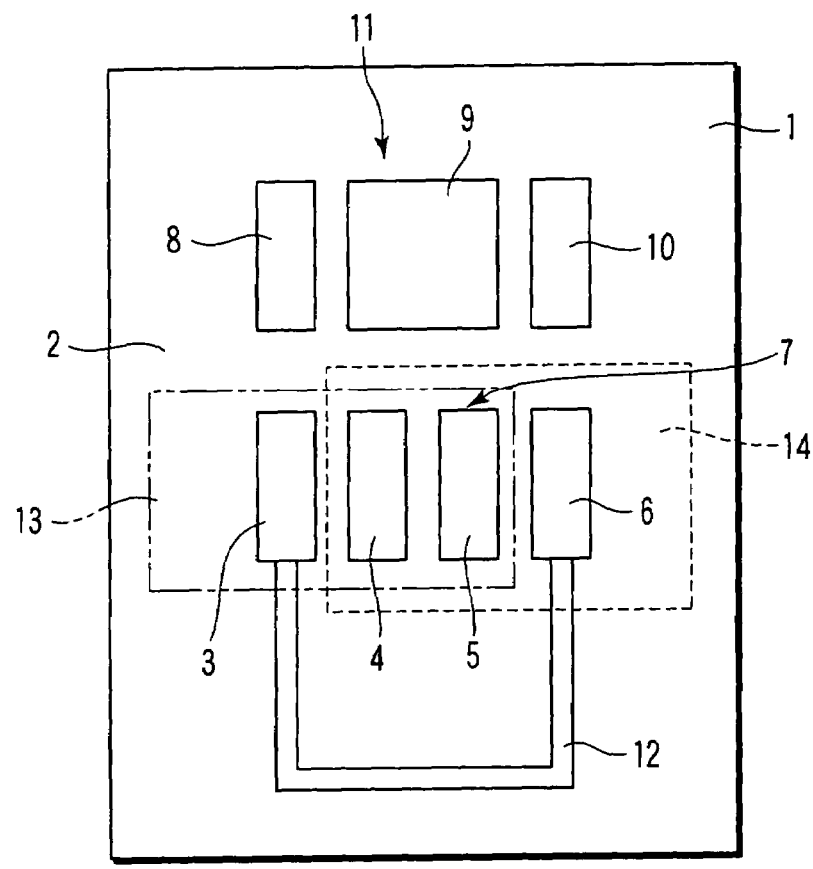
FIG. 1 is an exemplary plan view illustrating a printed circuit board according to a first embodiment.

FIG. 1 is a plan view illustrating a printed circuit board 1 according to a first embodiment.

In the drawings useful in explaining the embodiments of the invention, like reference numbers denote like elements, and duplication of description will be avoided.

The printed circuit board 1 comprises a component-mounting region 2 as a surface-mounting region, on which a three-terminal regulator IC is mounted.

Along one side of the component-mounting region 2 (the mounting region 2 is defined by opposite sides) of the printed circuit board 1, first to fourth pads 3 to 6 formed of, for example, solder and providing a pad device 7 are arranged with a certain pitch. The first and fourth pads 3 and 6 are connected to each other by a patterned wire 12.

Similarly, along the other side of the component-mounting region 2, a first radiator pad 8, common radiator pad 9 and second radiator pad 10, which provide a radiator-side pad device 11, are arranged with a preset gap defined between adjacent ones of the pads.

The first pad 3 is connected to a terminal Vin, the second pad 4 is connected to a terminal GND, the third pad 5 is connected to a terminal Vout, and the fourth pad 6 is connected to the terminal Vin. Further, the first radiator pad 8 is connected to the terminal GND, and the second radiator pad 10 is connected to the terminal Vout. The common radiator pad 9 is not connected to any terminal.

The first, second and third pads 3, 4 and 5 form a first land 13 for mounting thereon a first three-terminal regulator IC 16 with a first terminal-pin arrangement pattern, described later. Further, the second, third and fourth pads 4, 5 and 6 form a second land 14 for mounting thereon a second three-terminal regulator IC 17 with a second terminal-pin arrangement pattern, described later.

Figure 2:
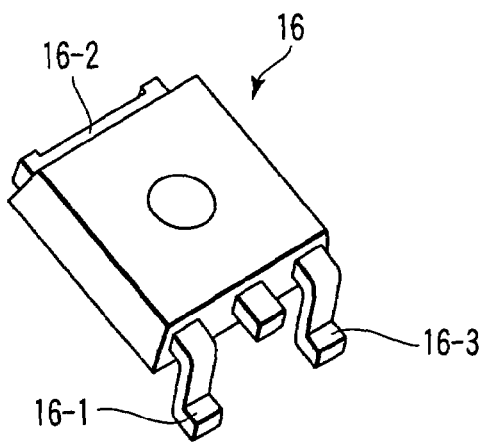
FIG. 2 is an exemplary perspective view illustrating a first three-terminal regulator IC to be mounted on the printed circuit board of FIG. 1.
Figure 3:
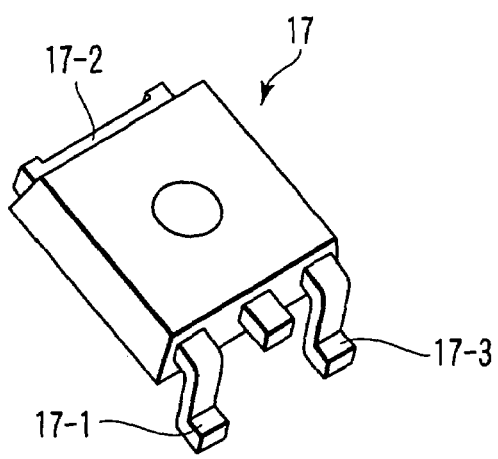
FIG. 3 is an exemplary perspective view illustrating a second three-terminal regulator IC to be mounted on the printed circuit board of FIG. 1.

FIG. 2 shows the first three-terminal regulator IC 16 with the first terminal-pin arrangement pattern, and FIG. 3 shows the second three-terminal regulator IC 17 with the second terminal-pin arrangement pattern different from the first terminal-pin arrangement pattern.

The first and second three-terminal regulator ICs 16 and 17 are rectangular when viewed from above, and have terminal pins provided along both sides and arranged in different patterns.

Specifically, in the first three-terminal regulator IC 16 shown in FIG. 2, the three terminal pins are connected to the terminals Vin, GND and Vout that are arranged clockwise in this order from a certain point. Namely, an input terminal pin 16-1 and output terminal pin 16-3 are formed along a certain side, and a GND terminal pin 16-2 is formed along the side parallel to the side along which the input and output terminal pins 16-1 and 16-3 are formed.

On the other hand, in the second three-terminal regulator IC 17 shown in FIG. 3, the three terminal pins are connected to the terminals GND, Vout and Vin that are arranged clockwise in this order from another point. Namely, a GND terminal pin 17-1 and an input terminal pin 17-3 are formed along a certain side, and an output terminal pin 17-2 is formed along the side parallel to the side along which the GND and input terminal pins 17-1 and 17-3 are formed.

A method of mounting the three-terminal regulator ICs will now be described.

Figure 4:
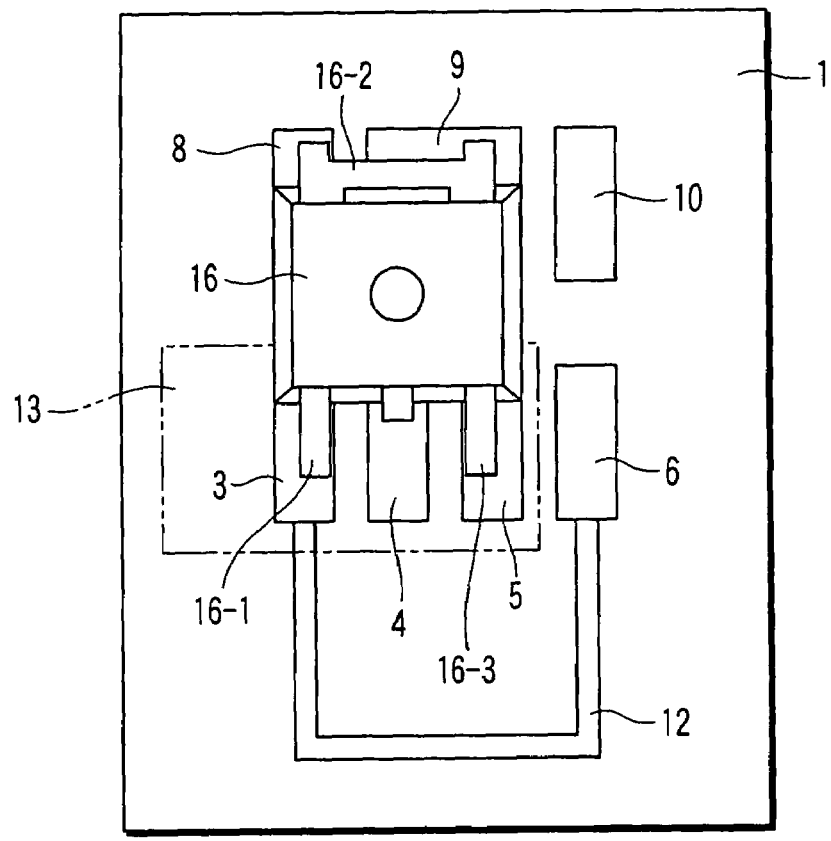
FIG. 4 is an exemplary plan view illustrating a state in which the first three-terminal regulator IC of FIG. 2 is mounted on the printed circuit board.

When the first three-terminal regulator IC 16 is mounted on the printed circuit board 1, it is positioned on the pads of the first land 13, and the input terminal pin 16-1 and output terminal pin 16-3 are connected to the first and third pads 3 and 5, respectively, and the GND terminal pin 16-2 is connected to the first radiator pad 8 and common radiator pad 9, as is shown in FIG. 4.

Figure 5:
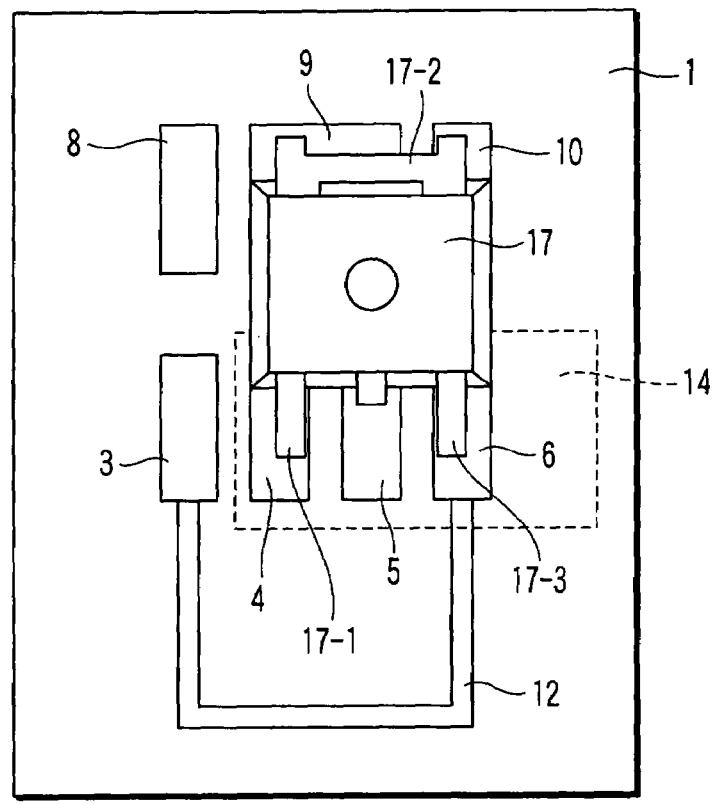
FIG. 5 is an exemplary plan view illustrating a state in which the second three-terminal regulator IC of FIG. 3 is mounted on the printed circuit board.

On the other hand, when the second three-terminal regulator IC 17 is mounted on the printed circuit board 1, it is positioned on the pads of the second land 14, and the GND terminal pin 17-1 and input terminal pin 17-3 are connected to the second and fourth pads 4 and 6, respectively, and the output terminal pin 17-2 is connected to the second radiator pad 10 and common radiator pad 9, as is shown in FIG. 5.

The above-described pad arrangements enable three-terminal regulator ICs of different terminal-pin patterns to be selectively mounted on a printed circuit board simply by clockwise or counterclockwise shifting the mounting position by one pad.

Thus, three-terminal regulator ICs of different terminal-pin patterns can be mounted easily, compared to the conventional case where a plurality of pads are connected to each other by a patterned conductor, or each three-terminal regulator IC is rotated through 180°. Further, the mounting structure can be made simpler than in the conventional case.

Also, the common radiator pad 9 is interposed between the first and second radiator pads 8 and 10. With this structure, when the first three-terminal regulator IC 16 is mounted, the radiator side is connected to the first radiator pad 8 and common radiator pad 9, and when the second three-terminal regulator IC 17 is mounted, the radiator side is connected to the second radiator pad 10 and common radiator pad 9. Accordingly, a sufficient radiating area can be secured, and hence excellent performance of the three-terminal regulator ICs can be maintained.

Even when the common radiator pad 9 is not used, a sufficient radiating area can be secured if the areas of the first and second radiator pads 8 and 10 are increased.

In this case, however, the first and second radiator pads 8 and 10 are located too close to each other. Therefore, when a three-terminal regulator IC is shifted to change the mounting position, the radiator side may contact both the first and second radiator pads to cause short-circuiting. This being so, a method of simply increasing the areas of the first and second radiator pads cannot be employed.

Figure 6:
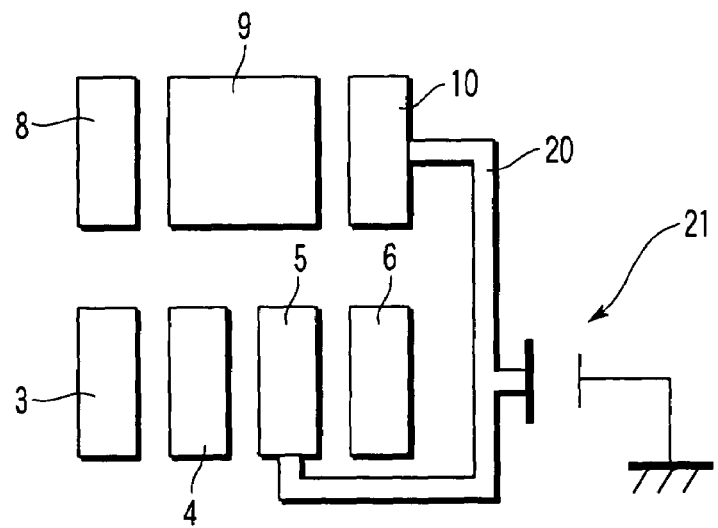
FIG. 6 is an exemplary plan view illustrating a printed circuit board according to a second embodiment.

FIG. 6 shows a second embodiment of the invention.

In the second embodiment, elements similar to those employed in the first embodiment are denoted by corresponding reference numbers, and no detailed description is given thereof.

In the second embodiment, when any one of the first and second three-terminal regulator ICs 16 and 17 is mounted, a ripple-eliminating capacitor 21 can be positioned near the output terminal pin 16-3 or 17-2, thereby reliably reducing the level of ripple noise.

Further, both a pad arrangement structure for mounting the first three-terminal regulator IC 16 and a pad arrangement structure for mounting the three-terminal regulator IC 17 may be employed. In this case, respective ripple-eliminating capacitors 21 can be positioned near the output terminal pins 16-3 and 17-2 of the first and second three-terminal regulator ICs 16 and 17. However, when two capacitors are provided, a greater substrate area is required than in the case where only one capacitor is used.

Figure 7:
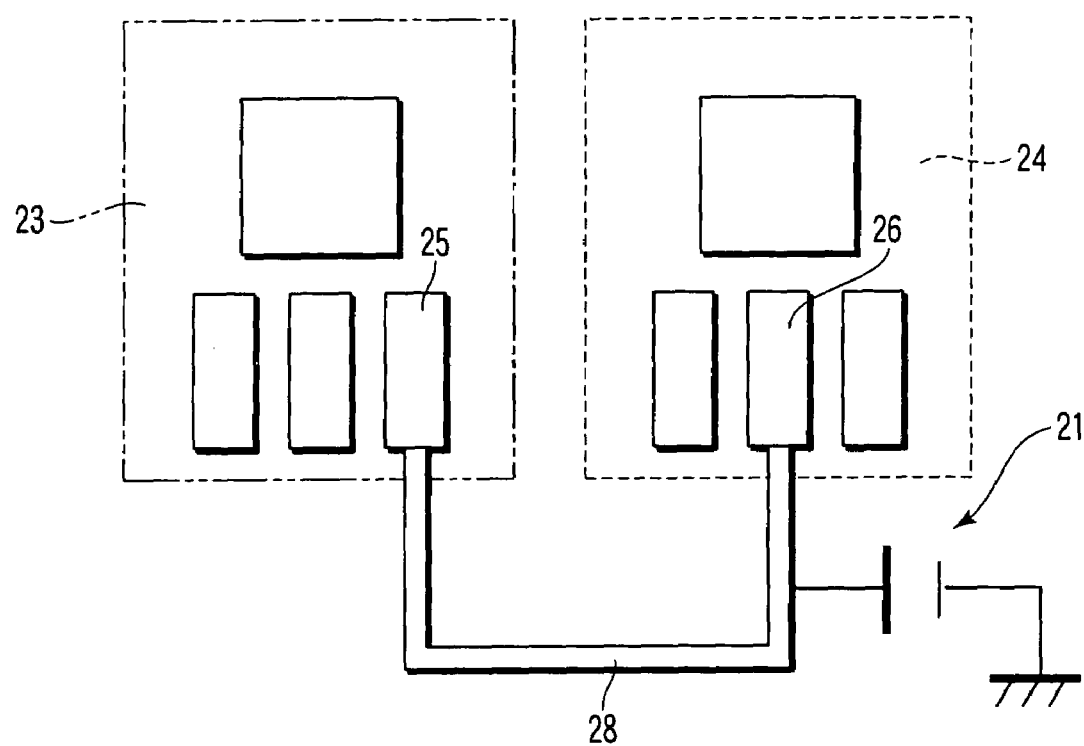
FIG. 7 is an exemplary view illustrating respective pad arrangements for the first and second three-terminal regulator ICs.

Alternatively, as is shown in FIG. 7, a pad arrangement structure 23 for mounting the first three-terminal regulator IC 16 and a pad arrangement structure 24 for mounting the three-terminal regulator IC 17 may be employed, and a common ripple-eliminating capacitor 21 may be connected, via a patterned wire 28, to a pad 25 that is connected to the output terminal pin of the first three-terminal regulator IC 16, and also to a pad 26 that is connected to the output terminal pin of the second three-terminal regulator IC 17.

In this case, however, since the output terminal pin 16-3 of the first three-terminal regulator IC 16 is far apart from the common ripple-eliminating capacitor 21, ripple noise may not sufficiently be reduced.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A printed circuit board comprising:
   a surface mounting area used to selectively mount thereon a first three-terminal regulator IC including an input terminal pin, an output terminal pin and a ground terminal pin arranged in a certain pattern, and a second three-terminal regulator IC including an input terminal pin, an output terminal pin and a ground terminal pin arranged in another pattern;
   a pad device including first to fourth pads arranged on the surface mounting area along one side thereof, with a preset gap defined between each pair of adjacent ones of the pads, the first to third pads forming a first land for mounting the first three-terminal regulator IC, the second to fourth pads forming a second land for mounting the second three-terminal regulator IC; and
   a radiator-side pad device including a first radiator pad and a second radiator pad arranged on the surface mounting area along another side thereof, with a preset gap defined therebetween, and a common radiator pad interposed between the first and second radiator pads, the ground terminal pin being connected to the first radiator pad and the common radiator pad when the first three-terminal regulator IC is mounted on the first land, the output terminal pin being connected to the second radiator pad and the common radiator pad when the second three-terminal regulator IC is mounted on the first land.

2. The printed circuit board according to claim 1, wherein the first and fourth pads are connected to each other via a patterned conductor and used as input pads, the second pad is used as a ground pad, and the third pad is used as an output pad.

3. The printed circuit board according to claim 1, wherein the third pad and the second radiator pad are connected to a ripple-eliminating capacitor via a patterned wire.

4. The printed circuit board according to claim 2, wherein the input and output terminal pins of the first three-terminal regulator IC are provided along one side thereof, and the ground terminal pin of the first three-terminal regulator IC is provided along another side thereof, the input and output terminal pins provided along the one side being connected to the first and third pads, respectively, the ground terminal pin provided along said another side being connected to the first radiator pad and the common radiator pad.

5. The printed circuit board according to claim 2, wherein the ground and input terminal pins of the second three-terminal regulator IC are provided along one side thereof, and the output terminal pin of the second three-terminal regulator IC is provided along another side thereof, the ground and input terminal pins provided along the one side being connected to the second and fourth pads, respectively, the output terminal pin provided along said another side being connected to the second radiator pad and the common radiator pad.

* * * * *